United States Patent [19]

Jakubzick

[11] Patent Number: 4,654,811
[45] Date of Patent: Mar. 31, 1987

[54] ADAPTIVE FILTER FOR AIRCRAFT NAVIGATION RECEIVER

[75] Inventor: Marcelo E. Jakubzick, Miami, Fla.

[73] Assignee: Allied Corporation, Morristown, N.J.

[21] Appl. No.: 701,007

[22] Filed: Feb. 12, 1985

[51] Int. Cl.$^4$ .......................... G06F 15/20; G01S 1/44
[52] U.S. Cl. ..................................... 364/572; 364/517; 343/401; 375/103
[58] Field of Search .............. 364/443, 449, 451, 572, 364/574, 724, 517; 343/401; 375/103; 328/167

[56] References Cited

U.S. PATENT DOCUMENTS

| | | | |
|---|---|---|---|
| 3,648,031 | 3/1972 | Neal | 364/572 |
| 3,778,602 | 12/1973 | Schmitt | 364/572 |
| 3,792,473 | 2/1974 | Sawicki | 343/401 |
| 3,908,115 | 9/1975 | Waggener | 364/572 |
| 4,121,287 | 10/1978 | Leal et al. | 364/572 |
| 4,590,579 | 5/1986 | Erb | 364/574 |

*Primary Examiner*—Gary Chin
*Attorney, Agent, or Firm*—Bruce L. Lamb; Robert M. Trepp

[57] ABSTRACT

A low-pass filter for digital bearing data from an aircraft navigation receiver in which the filter time constant is set to a high value when the receiver bearing data exhibits characteristics of a noisy signal received from a distant station where the bearing from the aircraft to the station can change only at a slow rate and in which the filter time constant is set to lower values for less filter delay when the receiver bearing data exhibits characteristics of a less noisy signal received from a nearer station where the bearing from the aircraft to the station can change at a higher rate. Receiver bearing data for a current sampling interval is compared to filtered bearing data for a previous sampling interval to determine change in magnitude of the difference. Such difference for a current sampling interval is compared with a similar difference for a previous sampling interval for change in algebraic sign. Filter time constant is set to higher values when difference magnitudes are small and sign changes are frequent and is set to lower values when difference magnitudes are larger and sign changes are infrequent.

8 Claims, 10 Drawing Figures

ADAPTIVE FILTER FOR AIRCRAFT NAVIGATION RECEIVER

The present invention relates to an adaptive filter for reducing the effects of noise upon the bearing indication provided by an aircraft navigation receiver. More particularly, it relates to a method for processing raw bearing data produced by an aircraft navigation receiver to select an optimum filter time constant and a method for digitally filtering the raw data in accordance with the selected time constant to provide output bearing information in which the effects of noise are substantially reduced without adversely affecting response characteristics of the navigation system.

Two common forms of aircraft navigation receivers providing relative bearing information are the VHF omni-range (VOR) receiver and the automatic direction finder (ADF) receiver. The VOR receiver provides bearing information in the form of magnetic bearing to or from a selected omni-range station. The ADF receiver provides bearing information in the form of relative bearing to a selected station operating in the broadcast frequency band or to a non-directional beacon transmitter. In either case, when an aircraft is some distance from the station being observed and flying on a constant heading, the bearing information provided by the navigation receiver, if free from noise, will change relatively slowly. As the aircraft nears the station the rate of change of the bearing indication increases, reaching a maximum as the aircraft flies over the station. The bearing information, however, is never free from noise, so that it is necessary to filter the information to reduce undesirable fluctuations in the bearing indication or in the aircraft flight control system, if the control system is coupled to the navigation receiver.

A low-pass, single pole type filter is suitable for use in reducing undesired fluctuations in the bearing information output of a navigation receiver. Desirably, such a filter possesses a long time constant, providing increased attenuation of high frequency components of the bearing information signal, when the distance between the aircraft and the observed station is comparatively large. At closer range, the filter time constant is shortened to reduce the attenuation of the high frequency components of the information signal. Such an adaptive filter does not adversely affect the response of a bearing indicator or a coupled flight control system since the long time constant filter, operating at the longer ranges, does not appreciably attenuate or delay the low frequency components of the information signal which changes slowly enough to be within the limits of the maximum possible rate of change of bearing, considering the limitations on aircraft performance. At close ranges, the shorter filter time constant permits higher frequency components of the information signal to pass without appreciable attenuation or delay, corresponding to the increase in the limits of the maximum possible rate of change of bearing as the aircraft approaches the observed station.

Adaptive filters have heretofore been proposed and used in connection with aircraft navigation receivers. One such filter is described in U.S. Pat. No. 3,792,473, issued Feb. 12, 1974 entitled "VOR Receiver with Adaptive Filters and Phase Shifters for Improved Accuracy". In this reference, a filter effectively equivalent to a filter having an adaptive time constant is achieved by using an analog voltage output from distance measuring equipment to control a limiter within an integrating loop. One disadvantage of the filter described in the reference is that the output of separate distance measuring equipment (DME) is required for operation and DME is not universally installed on aircraft. Also, even though DME may be installed on the aircraft, there may not be a cooperating DME ground station sharing the same location as the station being observed by the aircraft navigation receiver, in which case no distance measurement can be obtained.

It is an object of the present invention to provide an adaptive filter for the bearing information output signal of an aircraft navigation receiver in which the filter parameters are selected on the basis of characteristics of the bearing information signal.

Another object of the invention is to provide an adaptive filter for the bearing information output signal of an aircraft navigation receiver where the information signal is in digital format.

BRIEF DESCRIPTION

Briefly, the invention comprises a method of processing the raw bearing output data of an aircraft navigation receiver, in which, after initialization, a current raw data sample is compared with the filtered output data for the previous sampling interval to determine the magnitude of the difference and whether a sign change has occurred in the difference between the previous sampling interval and the current sampling interval. The magnitudes of such differences and the number of sign changes occurring between successive samples are periodically examined to determine a trend in the characteristics of the raw data signal. Frequent sign changes and small differences in magnitude between current and past data samples are characteristic of noisy data received at longer ranges from an observed station. Large differences in magnitude and zero or infrequent sign changes between current and past data samples are characteristic of data at closer ranges to an observed station. Filter condition numbers are established in accordance with such characteristics and a filter time constant is selected for processing each data sample based upon these condition numbers. Frequent sign changes and small differences in magnitude between current and past data samples lead to the selection of a longer filter time constant, while large changes in magnitude with few changes in sign of the compared data result in the selection of shorter filter time constants.

DETAILED DESCRIPTION

Figure 1A:
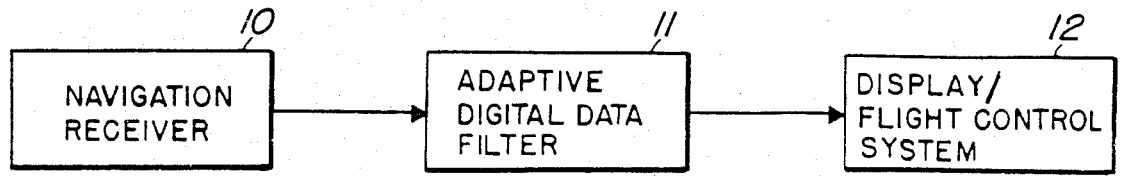
FIG. 1A is a functional block diagram of an aircraft navigation receiver incorporating the invention.
Figure 1B:
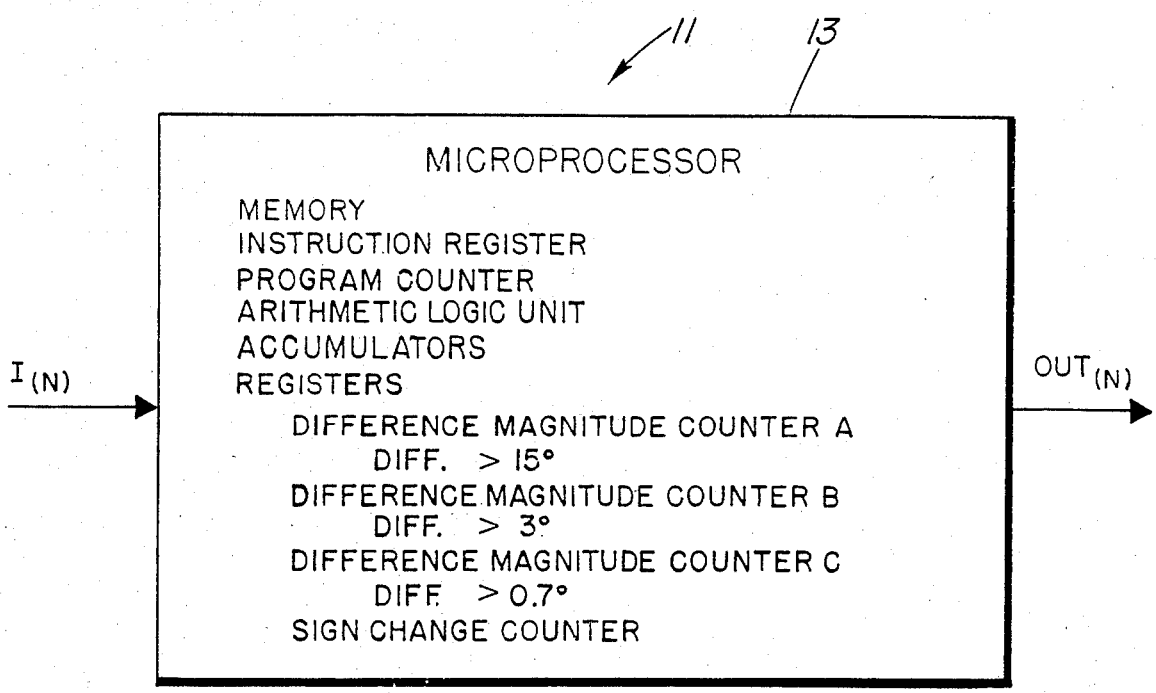
FIG. 1B is a diagram listing the major elements of a conventional microprocessor by which the adaptive filter of the invention is implemented.

Referring to FIGS. 1A and 1B, an aircraft navigation receiver 10, which may comprise a visual omni-range (VOR) receiver providing magnetic bearings to or from a selected ground station, in digital format, at the rate of thirty data samples per second, supplies raw data to an adaptive digital data filter 11, the subject of the invention. Adaptive filter 11, implemented by microprocessor means 13, processes the raw data from receiver 10 utilizing an algorithm which produces a response approximating the response of a linear single pole, low pass filter having a transfer function of the form $(E_o/E_1) = 1/[T(S)+1]$, where $E_o$ = filter output
$E_1$ = filter input
$T$ = filter time constant
$S$ = complex frequency.

As seen in FIG. 1B, adaptive filter 11, comprising microprocessor 13 includes, as is conventional, a memory, an instruction register, a program counter, an arithmetic logic unit, accumulators and registers. Three of the registers are denominated difference counters and a fourth is denominated sign change counter. The difference counters are incremented in accordance with whether the difference in magnitude between the raw data sample $I_{(N)}$ for the current sampling interval and the filter output $Out_{(N-1)}$ for the immediately preceding sampling interval is greater than 15° (counter A); lies between 3° and 15° (counter B) or lies between 0.7° and 3° (counter C). The sign change counter is incremented when a sign change in such difference has occurred for the current sampling interval.

Periodically, suitably every eighth sampling interval, the accumulated counts of the difference magnitude counters and sign change counter are examined to establish a filter time constant condition number. For each sampling interval, the filter time constant condition number and the difference magnitude for that interval are tested to set the filter time constant to be used for filtering the current data sample. After filtering with the time constant selected for the current sampling interval, the filter output OUT(N) is furnished, either as an analog signal or a digital signal, to a cockpit display 12 or to the aircraft flight control system for use as a guidance signal.

The raw data output from navigation receiver 10 is processed in adaptive filter 11 following the procedures illustrated in the flow charts of FIGS. 2 through 8.

The algorithm employed to approximate the response of a linear single pole, low pass filter is of the form:

$$\text{OUT}_{(N)} = \frac{1}{2^{(\alpha SHIFT-2)}} \left\{ \frac{\left[ \frac{(I_{(N)} + I_{(N-1)})}{2} - \text{OUT}_{N-1)} \right]}{2} \right\} + \text{OUT}_{(N-1)} \quad (1)$$

where:
$I_{(N)}$ is the raw bearing data for the current sampling interval;
$I_{(N-1)}$ is the raw bearing data for the last previous sampling interval;
OUT(N−1) is the filter output data for the last previous sampling interval;
($\alpha$SHIFT-2) is the number of recursions of the averaging shown in brackets; and
OUT(N) is the filter output for the current sampling interval.

Algorithm (1) approximates the response of the above noted linear filter transfer function where the filter time constant T is related to the duration t of the sampling interval and the number of $\alpha$SHIFT according to $$T = 2^{\alpha SHIFT-1} \cdot t \quad (2)$$

The smallest value assignable to $\alpha$SHIFT is two and the sampling interval, in one embodiment of the invention, is 0.0374 seconds. Consequently, the shortest filter time constant realizable through algorithm (1) is $T = 2 \times 0.0374 = 0.0748$ seconds.

Algorithm (1) involves averaging two angular data samples $I_N$ and $I_{N-1}$. Heed must be paid to the fact that the angles may not be of the same sign, where angles having values from zero to 180° are regarded as positive and angles having values of 180° to 360° are regarded as negative. For example, the average of 350° and 5° is 357.5°, not 177.5°. A routine titled AVERAGE TWO ANGLES is therefore employed in the implementation of algorithm (1).

Figure 2:
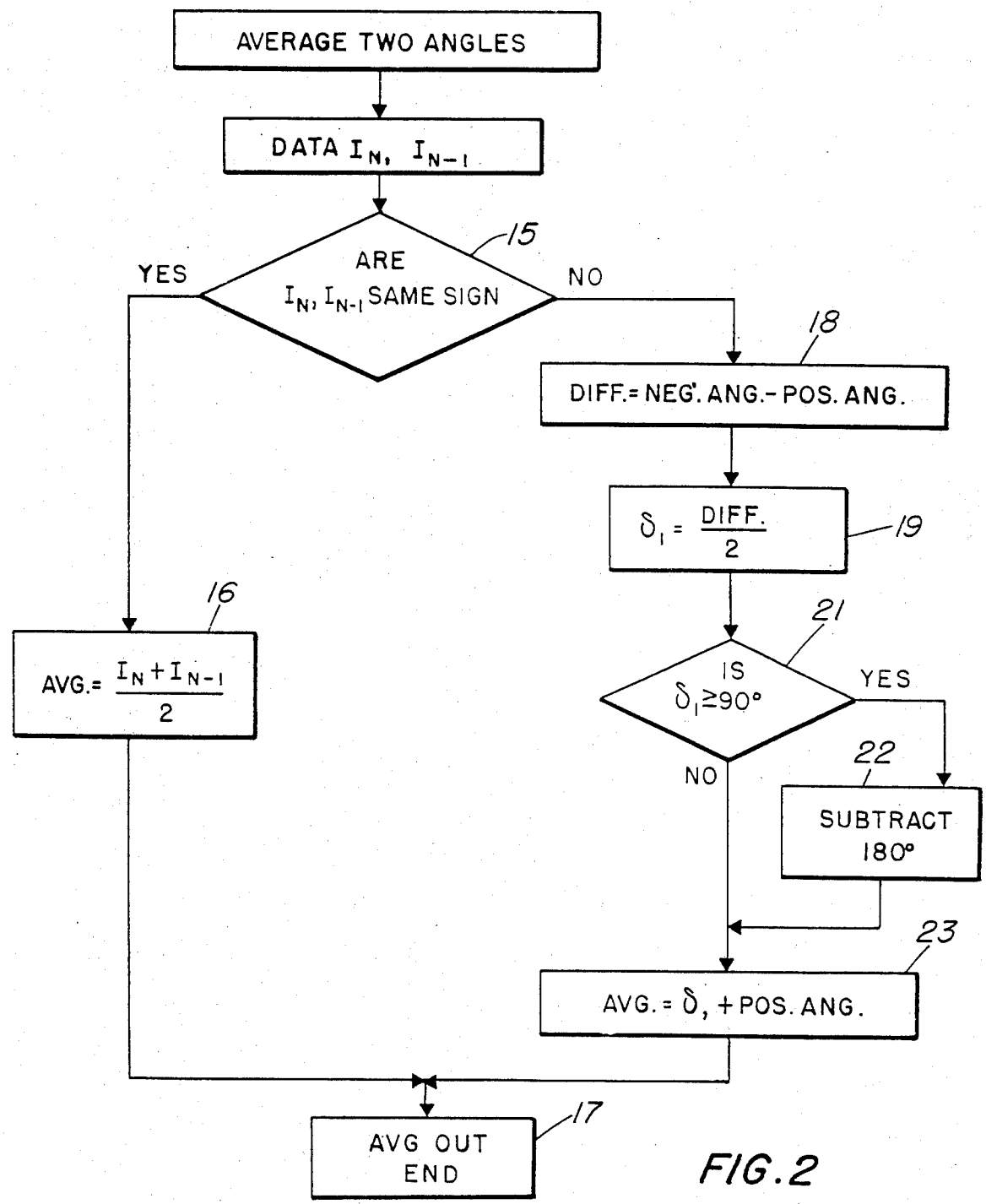
FIG. 2 is a flow chart illustrating the AVERAGE TWO ANGLES routine used in the invention.

Referring to the flow chart of FIG. 2, the routine AVERAGE TWO ANGLES accepts two angular inputs, which may be $I_N$, the raw bearing data for the current sampling interval and $I_{N-1}$, the raw bearing data for the previous sampling interval. In block 15, the data samples are tested for likeness of sign. If the samples are of the same sign (positive angles have values from 0° to 180°, negative angles have values from 180° to 360°), the arithmetic average of the two samples is produced in 16, furnished at the output 17 and the routine is exited. If the samples are of opposite sign, the samples are applied to block 18 where the positive angle is subtracted from the negative angle. The difference output of 18 is divided by two in 19 and the magnitude of the result $\delta_1$ is tested in block 21. If $\delta_1$ is equal to or greater than 90°, 180° is subtracted from $\delta_1$ in block 22 and the resulting difference is added to the positive angle in 23. If $\delta_1$ is less than 90°, $\delta_1$ is added to the positive angle sample in 23. The output of 23 appears at 17 as the average of the two input angles and the routine is exited.

Figure 3:
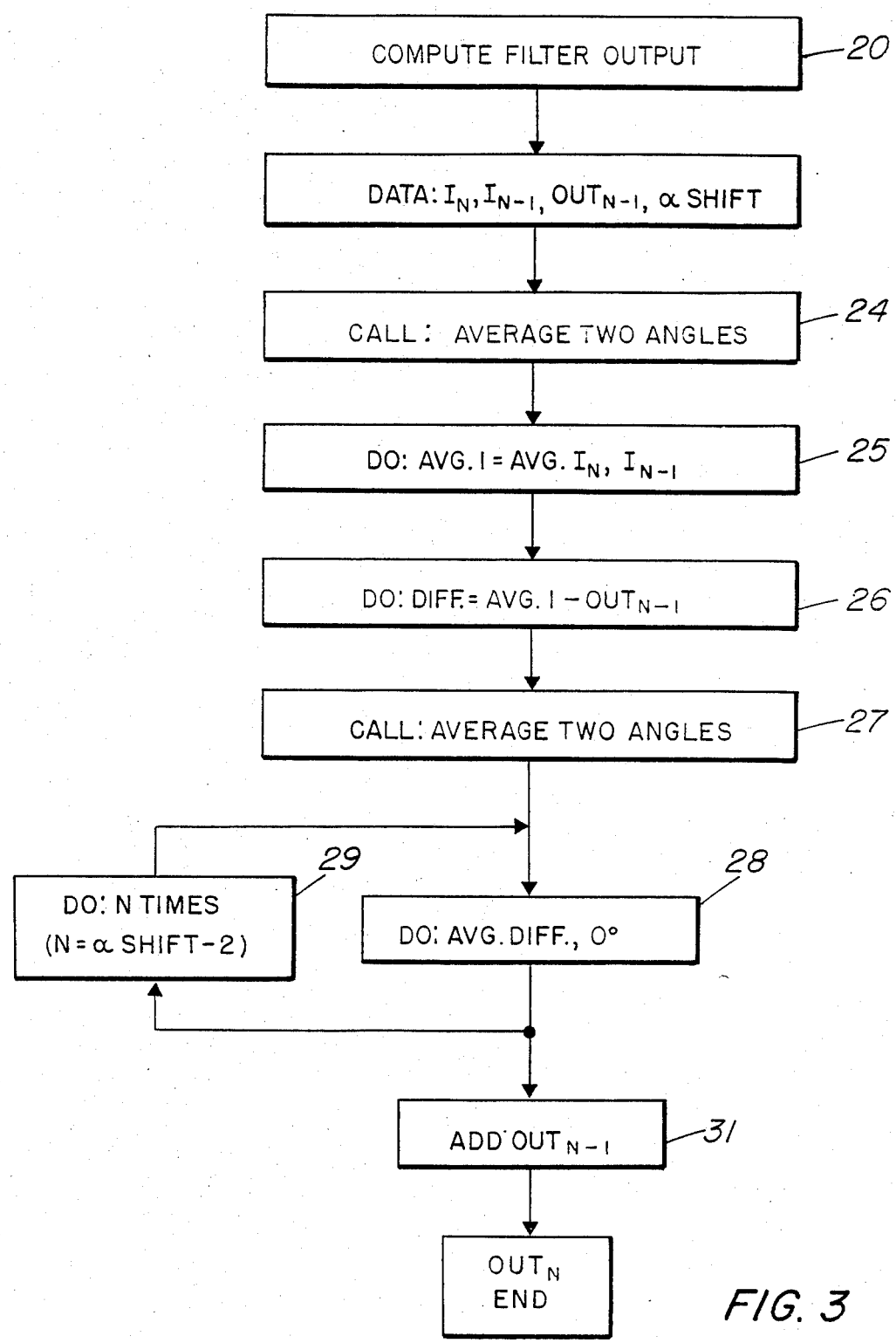
FIG. 3 is a flow chart illustrating the COMPUTER FILTER OUTPUT routine used in the invention.

The algorithm of equation (1) is implemented as shown in the flow chart of FIG. 3 in a routine titled COMPUTE FILTER OUTPUT. Input data for this routine comprises $I_N$, the raw bearing data for the current sampling interval; $I_{N-1}$, the raw bearing data for the previous sampling interval; $OUT_{N-1}$, the filtered bearing output for the previous sampling interval and $\alpha$SHIFT, a number which determines the filter time constant in accordance with equation (2).

After storing the input data in accessible locations, the routine AVERAGE OF TWO ANGLES is called in block 24. The average of $I_N$ and $I_{N-1}$ is produced in block 25 to provide the term $(I_N + I_{N-1})/2$ of equation (1), identified as AVG. 1. $OUT_{N-1}$ is subtracted from AVG. 1 in block 26 to produce DIFF, which is the term $$\left[ \frac{(I_N + I_{N-1})}{2} - OUT_{N-1} \right]$$

of equation (1). The routine AVERAGE OF TWO ANGLES is called in block 27 using as input data DIFF and 0°. The first performance of the routine produces, at the output of block 28, the term $$\left\{ \frac{\left[ \frac{(I_N + I_{N-1})}{2} - OUT_{N-1} \right]}{2} \right\}$$

of equation (1). Repetition of the routine of block 28 for N times, where N=αSHIFT-2, as shown by block 29, provides the product term $$\frac{1}{2^{\alpha SHIFT-2}} \left\{ \frac{\left[ \frac{(I_N + I_{N-1})}{2} \right] - OUT_{N-1}}{2} \right\}$$

of equation (1). When N repetitions of the routine of block 28 are completed, $OUT_{N-1}$ is added to the result in block 31 and the output thereof appears at 32 as the filtered bearing data $OUT_N$ for the current sampling interval.

Figure 4:
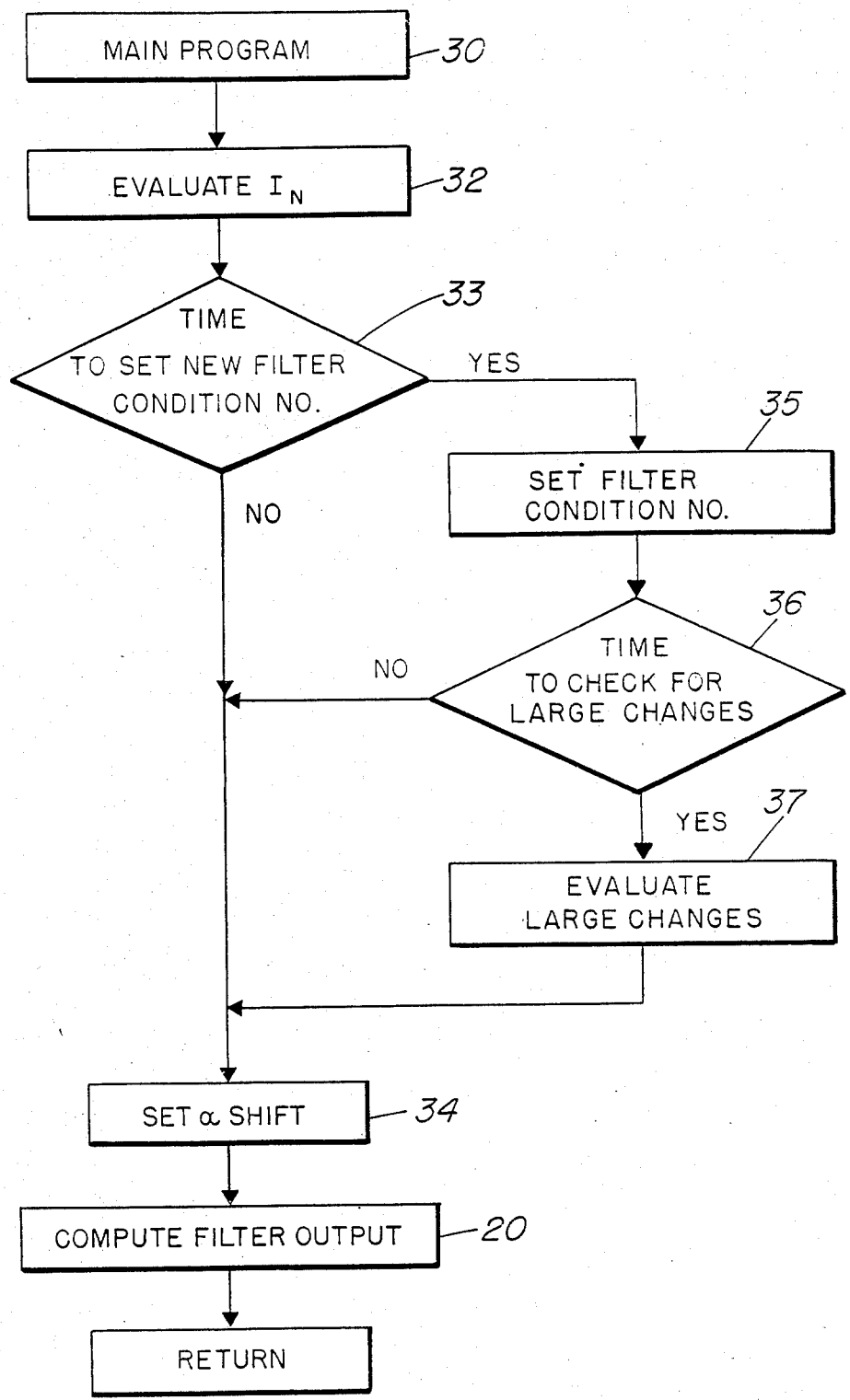
FIG. 4 is a flow chart illustrating the MAIN PROGRAM of the invention.

The main program 30 for the adaptive filter of the invention appears in FIG. 4 to which reference is now made. For each sampling interval, the raw bearing output $I_N$ of the navigation receiver is evaluated in a routine 32 titled EVALUATE $I_N$. In this routine, later described in greater detail, $I_N$ and $OUT_{N-1}$ are compared for incrementing the three previously mentioned difference magnitude counters and the sign change counter. Then, in decision block 33, the program cycle is checked to determine whether the time has arrived to set a new filter condition number. A new filter condition number is set every eighth sampling interval. These numbers are used in conjunction with the difference in magnitude between $I_N$ and $OUT_{N-1}$ to determine the filter time constant in a routine 34 titled SET ALPHA SHIFT, later described. If the current sampling interval is not one during which a new filter condition number is to be set, SET ALPHA SHIFT 34 is performed, followed by COMPUTE FILTER OUTPUT 20, described above with reference to FIG. 3, and the program returns to its beginning.

If the current sampling interval is one in which a new filter condition number is to be set, the main program branches from block 33 to a routine 35 titled SET FILTER CONDITION NUMBER, later described. On completion of this routine, the sampling interval number is checked in block 36 to determine whether the time has arrived to check for large changes in magnitude of $I_N$ compared with $OUT_{N-1}$. This time occurs once every sixteen sampling intervals. If the current interval is not a multiple of sixteen, the program proceeds to SET ALPHA SHIFT 34. Otherwise, a routine 37 titled EVALUATE LARGE CHANGES, later described, is performed which may result in a new filter condition number. Then the program returns to SET ALPHA SHIFT 34.

Figure 5:
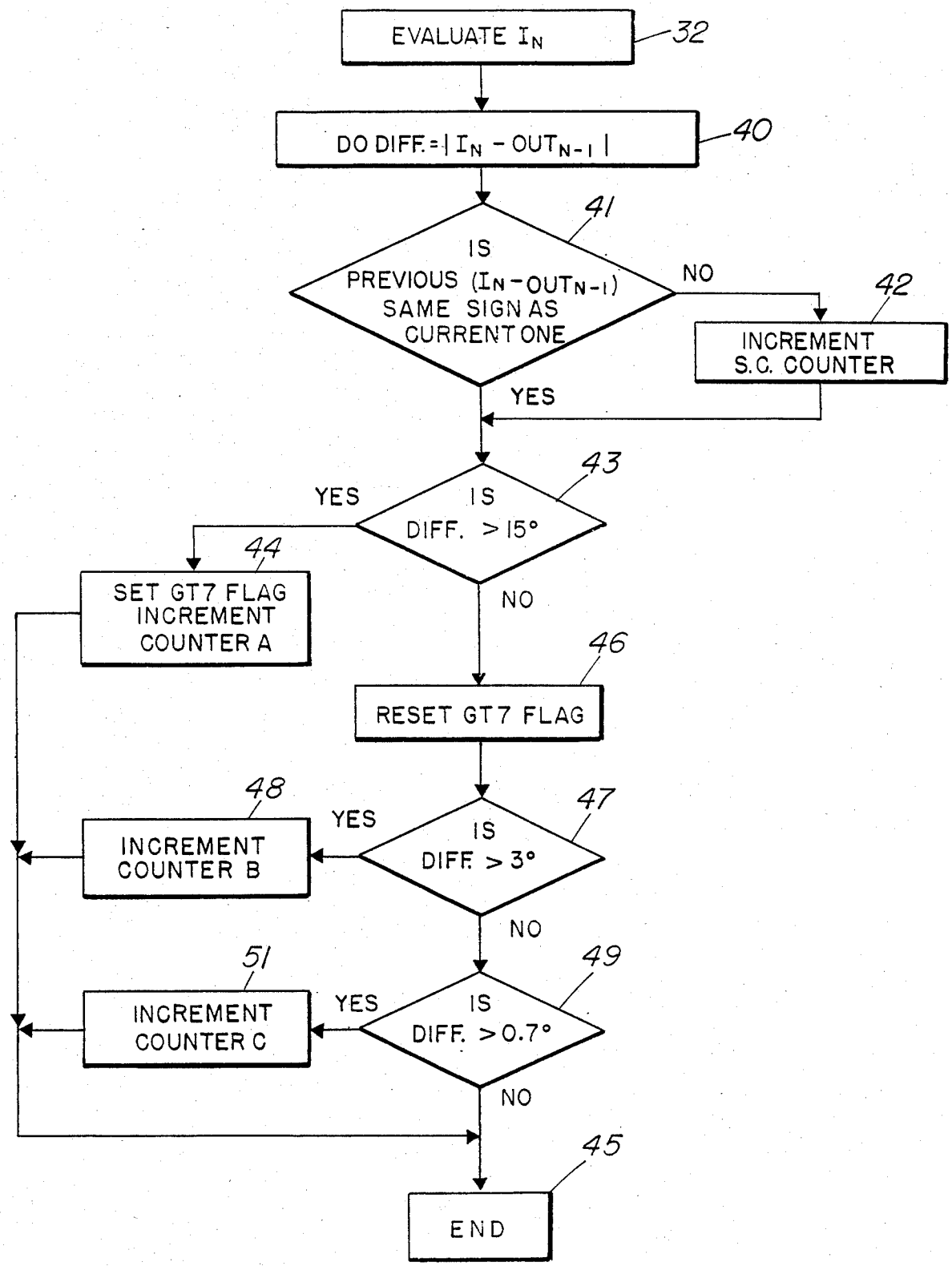
FIG. 5 is a flowchart illustrating the EVALUATE $I_N$ routine used in the invention.

EVALUATE $I_N$ routine 32 is illustrated in FIG. 5. The first step 40 performed provides DIFF, the absolute value of the difference in magnitude between $I_N$ and $OUT_{N-1}$. Then the previous $I_N$ and $OUT_{N-1}$ sign is compared in 41 with the current one. If the current $I_N$-$OUT_{N-1}$ sign is different from the previous one, a sign change counter is incremented in 42. Block 42 does not increment sign counter if $I_N$ is between 349° and 359° while $I_N$-$OUT_{N-1}$ is greater than 15°. Next, at 43, if the magnitude of DIFF is greater than 15°, a GT7 flag (greater than 15°) is set, counter A is incremented at 44 and the routine proceeds to END 45. If the magnitude of DIFF is less than or equal to 15° the GT7 flag is reset 46 and the magnitude of DIFF is checked at 47 for being greater than 3°. If DIFF is greater than 3°, counter B is incremented 48 and the routine ends. If the magnitude of DIFF is equal to or less than 3°, the magnitude is checked at 49 for being greater than 0.7°. If DIFF is greater than 0.7°, counter C is incremented 51 and the routine ends. Otherwise, the routine ends without any of the counters A, B or C being incremented. Counters B and C, respectively, record the number of sampling intervals, for an eight interval period, in which 3°<DIFF≦15° and 0.7°<DIFF≦3°. The sign change counter and counter A, respectively, record the number of sampling intervals, for a sixteen interval period, in which $I_N$ and $OUT_{N-1}$ differ in sign and in which DIFF>15°.

Figure 6:
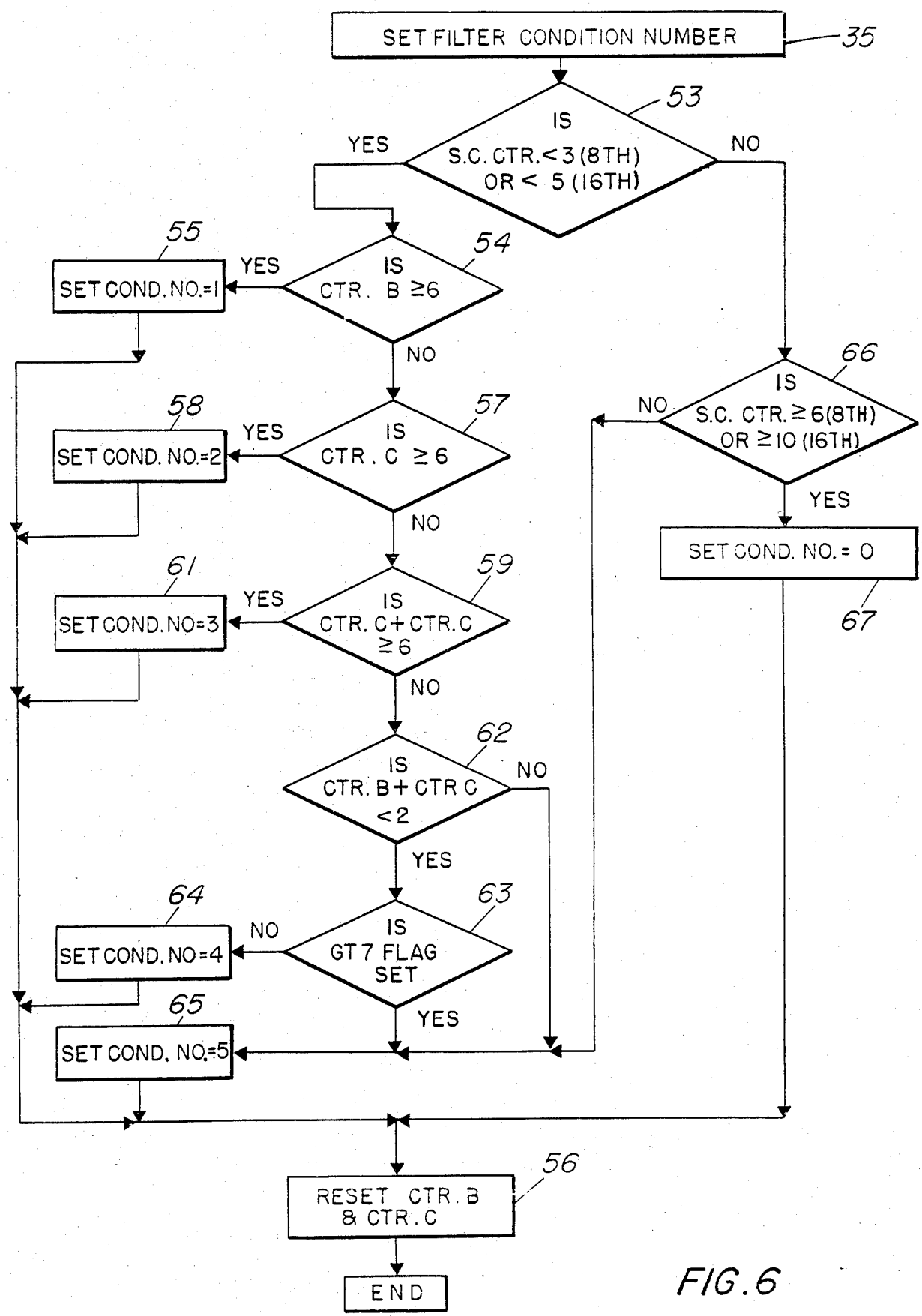
FIG. 6 is a flow chart illustrating the SET FILTER CONDITION NUMBER routine used in the invention.

The routine SET FILTER CONDITION NUMBER is illustrated in FIG. 6. This routine utilizes mainly the counts accumulated by counters B and C during an eight sample interval and the count accumulated by the sign change counter during an eight or sixteen sample interval period to establish a filter condition number of from zero to five. Filter condition number six may be set during the performance of the EVALUATE LARGE CHANGES routine, later described. Referring to FIG. 6, the first step, block 53, in SET FILTER CONDITION NUMBER is to check the accumulated count of the sign change (S.C.) counter. If the S.C. count is less than three, out of a possible total of eight, or less than five, out of a possible total of sixteen, the program branches to 54 where the count accumulated by counter B is checked. If counter B is greater than or equal to six, the condition number is set equal to one, at 55, counters B and C are reset at 56 and the routine ends. If counter B is less than six, counter C is checked at 57. If counter C has accumulated six or more counts, the condition number is set equal to two at 58, and the program jumps to 55. If the count of counter C is less than six, the sum of the counts of counters B and C is checked at 59. If such sum is equal to or greater than six, the condition number is set equal to three, at 61 and the program jumps to 56. If the sum of the counts of counters B and C is less than six, a check is made at 62 for a sum less than two. If the sum is less than two, the state of the GT7 flag is checked at 63. If the A counter is zero, the condition number is set equal to four at 64 and the program jumps to 56. If the A counter is not zero, the condition number is set equal to five, at 65 and the program proceeds to 56. If the sum of counters B and C, checked at 62 is not less than two, the condition number is set equal to five, at 65 and the program proceeds to 56.

Returning to block 53, if the S.C. counter has accumulated count greater than three or five (depending on the number of the sampling interval) the value of the S.C. count is checked at 66 for being equal to or greater than six or ten, out of a possible total of eight or sixteen.

If such number is greater than six or ten, the condition number is set equal to zero, at 67, and the program proceeds to 56. Otherwise, the condition number is set equal to five, at 65 and the program proceeds to 56, and then to END.

Figure 7:
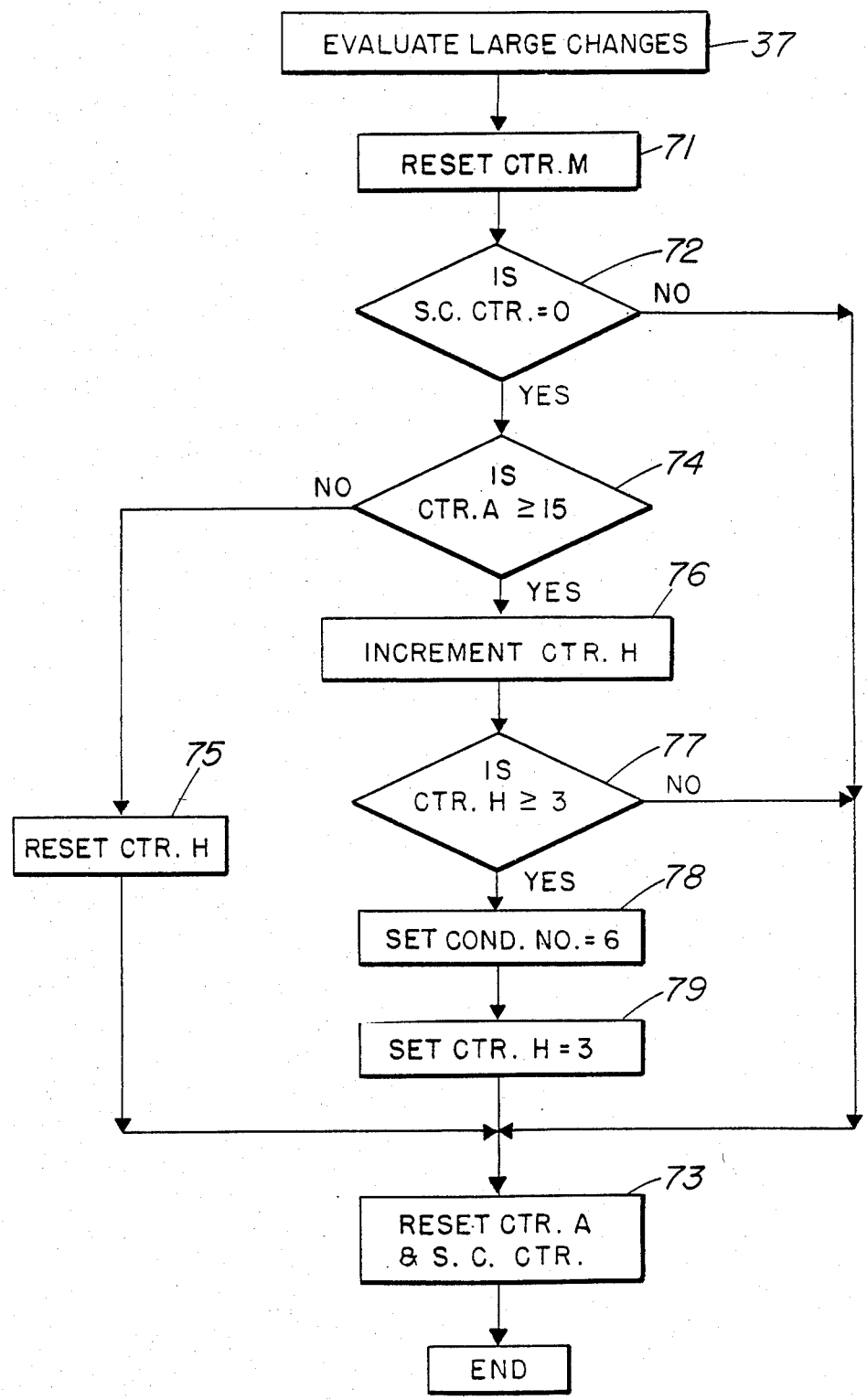
FIG. 7 is a flow chart illustrating the EVALUATE LARGE CHANGES routine used in the invention.

The EVALUATE LARGE CHANGES routine 37 of FIG. 4 is illustrated in FIG. 7. This routine involves two additional counters, counter M and counter H, and is performed once every sixteen sampling intervals as directed by block 36, FIG. 4. Counter M may be incremented during performance of the SET ALPHA SHIFT routine 34, as later described, to record the number of sampling intervals during which the GT7 flag has been set. Counter H records the number of sixteen sample interval periods, to a maximum of three periods, during which the accumulated count of counter A is equal to or greater than fifteen.

Referring to FIG. 7, the first step 71, in the EVALUATE LARGE CHANGES routine is to reset counter M. Next, the accumulated count of the S.C. counter is checked at 72. If such count is not equal to zero the program jumps to 73 where counter A and the S.C. counter are reset and the routine ends. If the S.C. counter is zero, the accumulated count of counter A is checked at 74 for a value equal to or greater than fifteen. If such count is less than fifteen, counter H is reset at 75 and the program jumps to 73. If such count is fifteen or greater, counter H is incremented at 76, then the accumulated count of counter H at 77 is checked for a value equal to or greater than three. If such count is less than three, the program jumps to 73. If counter H has reached a value of three or greater, the filter condition number is set equal to six at 78, then the count of counter H is set equal to three at 79 and the program proceeds through 73 to END.

Figure 8A:
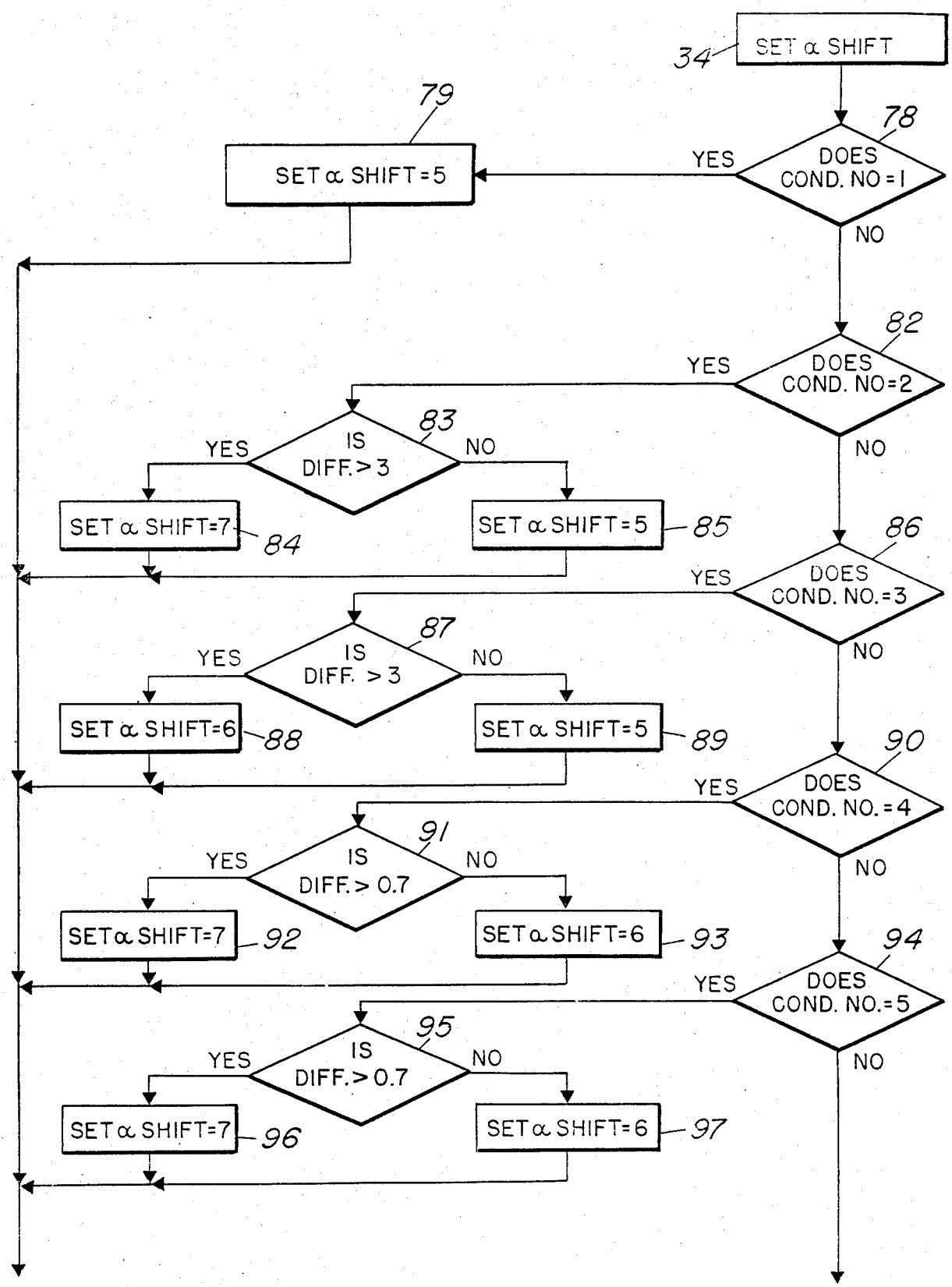
FIG. 8A and FIG. 8B, assembled, is a flow chart illustrating the SET ALPHA SHIFT routine used in the invention.
Figure 8B:
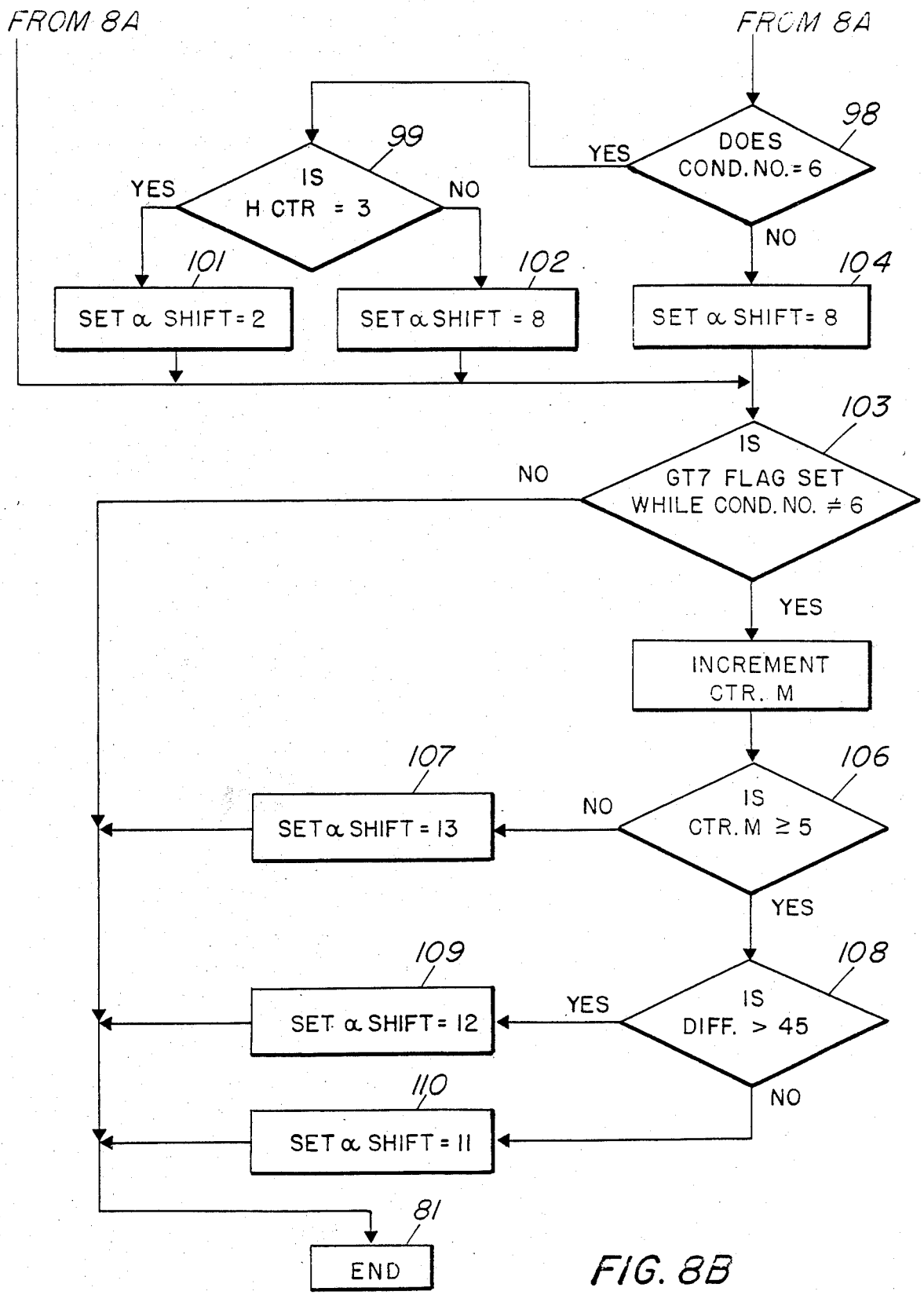

The SET ALPHA SHIFT routine 34 of FIG. 4 is illustrated in FIG. 8. This routine determines, for each sampling interval, the filter time constant to be used for filtering the current data sample in COMPUTE FILTER OUTPUT based on the condition number set in the routines of FIGS. 6 or 7 and the magnitude of the difference between $I_N$ and $OUT_{N-1}$. Referring to FIG. 8, the first step 78 in this routine is to check whether condition number one is set. If so, $\alpha$SHIFT is set equal to five at 79 and the routine goes to 103. If not, condition number two is checked at 82. If the condition number is two, the magnitude of DIFF=$I_N-O_{N-1}$ is checked at 83. If DIFF is greater than 3°, $\alpha$SHIFT is set equal to seven, at 84, and the routine goes to 103. If DIFF is equal to or less than 3°, $\alpha$SHIFT is set equal to five, at 85, and the program goes to 103.

If condition number two is not set, condition number three is checked at 86. If the condition number is three, the value of DIFF is checked at 87. If DIFF is greater than 3°, $\alpha$SHIFT is set equal to six, at 88, and the routine goes to 103. If DIFF is not greater than 3°, $\alpha$SHIFT is set equal to five, at 89, and the routine goes to 103.

If the condition number is not three, condition number four is checked at 90. If the condition number is four, the value of DIFF is checked at 91. If DIFF is greater than 0.7°, $\alpha$SHIFT is set equal to seven, at 92, and the routine goes to 103. If DIFF is not greater than 0.7°, $\alpha$SHIFT is set equal to six, at 93, and the routine goes to 103.

If the condition number is not four, condition number five is checked at 94. If the condition number is five, the value of DIFF is checked at 95. If DIFF is greater than 0.7°, $\alpha$SHIFT is set equal to seven, at 96, and the routine ends. If DIFF is not greater than 0.7°, $\alpha$SHIFT is set equal to six, at 97, and the routine goes to 103.

If the condition number is not five, condition number six is checked at 98. If the condition number is six, the value of the count accumulated by the H counter is checked at 99. The H counter is incremented during performance of EVALUATE LARGE CHANGES, FIG. 7. If the H counter has accumulated count equal to three, a $\alpha$SHIFT is set equal to two, at 101, and the routine goes to 103. If the H count is less than three, a $\alpha$SHIFT is set equal to eight, at 102, and the routine goes to 103. Note that H counter saturates at 3, that is, increment of H at H=3 gives H=3 (and not H=4).

At point 98, if the condition number is not 6, then $\alpha$SHIFT is set to 8 (default $\alpha$shift) at point 104. At point 103, if GT7 flag is set while not on condition No. 6, then counter M is incremented at 105, then the accumulated count of counter M is checked at 106. If such count is less than five, $\alpha$SHIFT is set equal to thirteen, at 107, and the routine ends. If the count value of counter M is equal to or greater than five, the value of DIFF is checked at 108. If DIFF is greater than 45°, $\alpha$ SHIFT is set equal to twelve, at 109, and the routine ends. If DIFF is equal to or less than 45°, $\alpha$ SHIFT is set equal to eleven, at 110, and the routine ends. Otherwise, the routine ended after check at point 103.

Reviewing the operaation of the SET FILTER CONDITION NUMBER and SET ALPHA SHIFT routines, it will be seen that condition numbers one through five are set when less than about one-third of the data samples, for an eight or sixteen sample interval period, show sign changes. Condition number zero, set when the S.C. counter has accumulated a high count, produces an $\alpha$ SHIFT number of 8 for the longest filter time constant for changes less than 15°. Condition number six, set for zero S.C. count and large values of counter A count can result in setting $\alpha$ SHIFT equal to two, for the shortest filter time constant, or greater than 10, depending on whether large values of count from counter A persist through more than three sixteen sample interval periods.

The invention claimed is:

1. The method of processing bearing data from an aircraft navigation receiver to provide adaptively filtered output bearing data, said receiver bearing data being provided in digital format at successive sampling intervals, comprising the steps of comparing a receiver bearing data sample for a current sampling interval with a filtered output bearing data sample for the sampling interval last previous to the current sampling interval to determine the difference in magnitude of said compared bearing data samples;

comparing the algebraic sign of said difference between said bearing data sample for the current sampling interval and said filtered output bearing data sample for the last previous sampling interval with the algebraic sign of the difference between the bearing data sample for the last previous sampling interval and the filtered output bearing data sample for the next to last previous sampling interval to determine whether said compared algebraic signs differ;

incrementing one of a plurality of difference magnitude counters in accordance with the difference in magnitude of said compared bearing data samples, said difference magnitude counters each being assigned a different range of magnitude values;

incrementing a sign change counter whenever said compared algebraic signs differ;

establishing a filter condition number based upon the accumulated counts of said difference magnitude counters and said sign change counter;

establishing a filter time constant based on said filter condition number and the difference in magnitude of said compared data samples; and computing an output bearing data sample for the current sampling interval using a low pass digital filter routine in accordance with said established filter time constant.

2. The method of processing bearing data from an aircraft navigation receiver as claimed in claim 1 wherein said step of computing an output bearing data sample includes the steps of:

averaging the bearing data sample from the aircraft navigation receiver for the current sampling interval with the bearing data sample from the aircraft navigation receiver for the last previous sampling interval;

subtracting from the average of said bearing data samples from the aircraft receiver the filtered output bearing data sample for the last previous sampling interval to provide a difference;

repeatedly averaging said difference with zero for N repetitions, where N is a function of said established filter time constant;

adding to the result of said N repetitive averagings the filtered output bearing data sample for the last previous sampling interval to provide the filtered output bearing data sample for the current sampling interval; and storing said filtered output bearing data sample for the current sampling interval for use in computing an output bearing data sample during the next to follow sampling interval.

3. The method of processing bearing data from an aircraft navigation receiver as claimed in claim 2 wherein the step of establishing a filter time constant includes the step of selecting an alpha shift number based on said filter condition number and said difference in magnitude of said compared data samples and wherein the number N of said N repetitive averagings is equal to said selected alpha shift number minus 2.

4. The method of processing bearing data from an aircraft navigation receiver as claimed in claim 3 wherein said difference magnitude counters comprise:

a first counter which is incremented whenever said difference in magnitude of said compared bearing data samples is greater than a first value;

a second counter which is incremented whenever said difference in magnitude of said compared bearing data samples is greater than a second value, lower than said first value, and less than or equal to said first value; and a third counter which is incremented whenever said difference in magnitude of said compared bearing data samples is greater than a third value, lower than said second value, and less than or equal to said second value.

5. The method of processing bearing data from an aircraft navigation receiver as claimed in claim 4 wherein the step of establishing a filter condition number includes the steps of:

determining whether the count accumulated by said sign change counter has exceeded a first threshold value at the end of a fixed period of sampling intervals;

determining, whenever said count of said sign change counter is below said first threshold value, whether the count accumulated by said second counter during said fixed period has equaled or exceeded a second threshold value;

setting a first filter condition number if said count of said second counter equals or exceeds said second threshold value;

determining whether the count accumulated by said third counter has equaled or exceeded a third threshold value, if the said count accumulated by said second counter has not equaled or exceeded said second threshold value;

setting a second filter condition number, higher than said first filter condition number, whenever said count accumulated by said third counter equals or exceeds said third threshold value;

determining whether said count accumulated by said sign change counter equals or exceeds a fourth threshold value, if said count accumulated by said sign change counter is greater than said first threshold value;

setting a third filter condition number, lower than said first filter condition number, if said count accumulated by said sign change counter equals or exceeds said fourth threshold value;

setting a fourth filter condition number, higher than said second filter condition number, if said count accumulated by said sign change counter does not equal or exceed said fourtth threshold value; and resetting said second and third counters and ending the steps of establishing a filter condition number whenever any one of said filter condition numbers has been set.

6. The method of processing bearing data from an aircraft navigation receiver as claimed in claim 5 including the additional steps of:

determining whether the sum of the counts accumulated by said second and third counters equals or exceeds a fifth threshold value;

setting a fifth filter condition number higher than said second filter condition number but lower than said fourth condition number if said sum of the counts accumulated by said second and third counters equals or exceeds said fifth threshold value;

determining whether said sum of the counts accumulated by said second and third counters is less than a sixth threshold value if said sum of counts does not equal or exceed said fifth threshold value;

setting a sixth filter condition number equal to said fourth filter condition number if said sum of counts is not greater than said sixth threshold value;

determining whether said first counter has been incremented at least once during said fixed period of sampling intervals;

setting a seventh filter condition number higher than said fifth filter condition number but lower than said fourth filter condition number if said first counter has not been incremented; and setting an eighth filter condition number, equal to said fourth filter condition number, if said first counter has been incremented at least once.

7. The method of processing bearing data from an aircraft navigation receiver as claimed in claim 5 wherein said step of selecting an alpha shift number includes the steps of:
- determining whether said first filter condition number has been set;
- setting said alpha shift number to a first value if said first filter condition number has been set;
- determining whether said second filter condition number has been set, if said first filter condition number has not been set;
- determining whether the difference between the receiver bearing data for the current sampling interval and the filtered output bearing data sample for the last previous sampling interval is greater than a first amount, if said second filter condition number has been set;
- setting said alpha shift number to a second value higher than said first value alpha shift if said difference between said current interval and last previous interval data samples is greater than said first amount;
- setting said alpha shift number to said first value if said difference between said current interval and last previous interval data samples is not greater than said first amount; and
- ending the steps of setting an alpha shift number whenever any one alpha shift number has been set.

8. The method of processing bearing data from an aircraft navigation receiver as claimed in claim 4 wherein
- said first value of said first counter is fifteen degrees;
- said second value of said second counter is three degrees; and
- said third value of said third counter is seven-tenths of one degree.

* * * * *